(12) United States Patent
Norman et al.

(10) Patent No.: US 7,940,833 B2
(45) Date of Patent: May 10, 2011

(54) TRANSMITTER WITH INTELLIGENT PRECONDITIONING OF AMPLIFIER SIGNAL

(75) Inventors: Mårten Norman, Spånga (SE); Thomas Östman, Spånga (SE); Bo Hagerman, Tyresö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 746 days.

(21) Appl. No.: 11/425,410

(22) Filed: Jun. 21, 2006

(65) Prior Publication Data
US 2007/0297492 A1 Dec. 27, 2007

(51) Int. Cl.
*H04B 1/00* (2006.01)
(52) U.S. Cl. ........................................ 375/146; 375/130
(58) Field of Classification Search .................. 375/146, 375/140, 130; 370/319
See application file for complete search history.

(56) References Cited

U.S. PATENT DOCUMENTS

| | | | |
|---|---|---|---|
| 5,812,543 A * | 9/1998 | Sugita | 370/335 |
| 6,459,693 B1 * | 10/2002 | Park et al. | 370/342 |
| 2001/0012317 A1 * | 8/2001 | Jin et al. | 375/148 |
| 2002/0036569 A1 * | 3/2002 | Martin | 340/573.1 |
| 2002/0057131 A1 | 5/2002 | Matsushita et al. | |
| 2003/0146791 A1 | 8/2003 | Shvarts et al. | |
| 2003/0153285 A1 * | 8/2003 | Dekker | 455/104 |
| 2004/0024588 A1 * | 2/2004 | Watson et al. | 704/200.1 |
| 2004/0174218 A1 | 9/2004 | Dupuis et al. | |
| 2004/0229579 A1 | 11/2004 | Tsutsui et al. | |
| 2005/0223403 A1 * | 10/2005 | Suito et al. | 725/32 |
| 2005/0245212 A1 | 11/2005 | Ono et al. | |
| 2005/0285765 A1 * | 12/2005 | Suzuki et al. | 341/143 |
| 2006/0028277 A1 | 2/2006 | Yamashita et al. | |
| 2007/0133445 A1 * | 6/2007 | Bi et al. | 370/310 |
| 2007/0287464 A1 * | 12/2007 | Hamamoto et al. | 455/447 |

OTHER PUBLICATIONS

International Search Report and Written Opinion mailed May 14, 2007 in corresponding PCT application No. PCT/SE2006/050366.
Young et al, "An Adaptive Feed Forward Amplifier for WCDMA Base Stations Using Imperfect Signal Cancellation", Microwave Journal, Technical Feature, published Apr. 1, 2003.
International Preliminary Report on Patentability mailed Jan. 8, 2009 in corresponding PCT Application No. PCT/SE2006/050366.
English translation of the Chinese Office Action mailed Apr. 8, 2010 in corresponding Chinese application No. 200680055061.1.

* cited by examiner

*Primary Examiner* — David C Payne
*Assistant Examiner* — Brian J Stevens
(74) *Attorney, Agent, or Firm* — Nixon & Vanderhye, P.C.

(57) ABSTRACT

A transmitter (20) for a code division multiple access radio access network intelligently preconditions a channel-merged signal which is applied to its amplifier (22) so that the amplifier does not experience, e.g., precipitous power changes. The transmitter (20) comprises an amplifier (22) for amplifying the channel-merged signal at a signal output power; a detector (24) for performing detection of when output power of the channel-merged signal is about to change by a specified amount; and, a noise inserter (26) for adding a noise signal to the channel-merged signal in dependence upon the detection. Insertion of the noise smoothes an edge of the power change curve and thereby averts stress for the amplifier.

28 Claims, 11 Drawing Sheets

TRANSMITTER WITH INTELLIGENT PRECONDITIONING OF AMPLIFIER SIGNAL

BACKGROUND

I. Field of the Invention

The present invention pertains to telecommunications, and particularly to a wideband code division multiple access (WCDMA) or other code division multiple access (CDMA) based cellular base station transmitter system.

II. Related Art and Other Considerations

In a typical cellular radio system, wireless user equipment units (UEs) communicate via a radio access network (RAN) to one or more core networks. The user equipment units (UEs) can be mobile stations such as mobile telephones ("cellular" telephones) and laptops with mobile termination, and thus can be, for example, portable, pocket, hand-held, computer-included, or car-mounted mobile devices which communicate voice and/or data with radio access network. Alternatively, the wireless user equipment units can be fixed wireless devices, e.g., fixed cellular devices/terminals which are part of a wireless local loop or the like.

The radio access network (RAN) covers a geographical area which is divided into cell areas, with each cell area being served by a base station. A cell is a geographical area where radio coverage is provided by the radio base station equipment at a base station site. Each cell is identified by a unique identity, which is broadcast in the cell. The base stations communicate over the air interface (e.g., radio frequencies) with the user equipment units (UE) within range of the base stations. In the radio access network, several base stations are typically connected (e.g., by landlines or microwave) to a radio network controller (RNC). The radio network controller, also sometimes termed a base station controller (BSC), supervises and coordinates various activities of the plural base stations connected thereto. The radio network controllers are typically connected to one or more core networks. The core network has two service domains, with an RNC having an interface to both of these domains.

One example of a radio access network is the Universal Mobile Telecommunications (UMTS) Terrestrial Radio Access Network (UTRAN). The UMTS is a third generation system which in some respects builds upon the radio access technology known as Global System for Mobile communications (GSM) developed in Europe. UTRAN is essentially a radio access network providing wideband code division multiple access (WCDMA) to user equipment units (UEs). The Third Generation Partnership Project (3GPP) has undertaken to evolve further the UTRAN and GSM-based radio access network technologies.

As those skilled in the art appreciate, in WCDMA technology a common frequency band allows simultaneous communication between a user equipment unit (UE) and plural base stations. Signals occupying the common frequency band are discriminated at the receiving station through spread spectrum CDMA waveform properties based on the use of a high speed, pseudo-noise (PN) code. A PN pattern or code is a long string of bits that meets certain random properties in order to make each Data Channel to look like random noise. These high speed PN codes are used to modulate signals transmitted from the base stations and the user equipment units (UEs). Transmitter stations using different PN codes (or a PN code offset in time) produce signals that can be separately demodulated at a receiving station. The high speed PN modulation also allows the receiving station to advantageously generate a received signal from a single transmitting station by combining several distinct propagation paths of the transmitted signal.

Pseudo-noise (PN) codes can be utilized in CDMA systems other than WCDMA. In a typical CMDA system, a number of data channels are each multiplied with a pseudo noise (PN) pattern assigned to the respective data channel. For example, data channel 1 is multiplied with PN1 (Pseudo Noise code1), data channel 2 is multiplied with PN2 (Pseudo Noise code2), and so forth. After this, the resultant pattern for each channel has properties similar to white noise. Then the resultants for the channels are added into one carrier, so that the merged or composite signal also looks like white noise. The merged carrier is then amplified with a wideband power amplifier, e.g., a Multi Carrier Power Amplifier (MCPA).

At the receiver end, mobile stations (such as cellular phones) are tuned to a respective assigned PN code. For example, one cellular phone may be capable of restoring data channel 1 from the "noise" by using Pseudo Noise code1 (PN1), but will see all the other data channels as random noise. Another cellular phone may be capable of restoring data channel 2 by using Pseudo Noise code2 (PN2), and so forth.

Thus, at the transmitter, the signal fed to the MCPA is a sum of several random vectors, and as such imparts certain properties and/or operational characteristics in certain circumstances. For example, if all vectors are in phase, the sum of the vectors will have very high amplitude. On the other hand, if all vectors cancel out, the sum of the vectors will have essentially no output signal at all. Moreover, the signal power can drop or increase much greater than 50 dB instantly (from one 3.84 MHz chip to another in WCDMA). While these circumstances are extremes and may be infrequent, the fact that an amplitude spike can be very high is indeed a significant problem.

The problem of an amplitude spike is that quick drops or rises in output power causes significant stress of the Multi Carrier Power Amplifier (MCPA). Stress of/to the Multi Carrier Power Amplifier (MCPA) can cause such phenomena as (1) current peaks that put stress on the whole RBS power supply; (2) significant electromagnetic interference (EMI); and (3) noise on the MCPA output signal. High amplitude spikes could lead to a need to over dimension the MCPA.

Traditionally, power clipping is one traditional technique that has been utilized to cut or attenuate the extreme high amplitude peaks. Power clipping is only activated at a certain (e.g., very high) level, i.e., the clipping level. A sharp peak or rise from a low level to a level just below the clipping level may not result in clipping, but still can be a severe problem.

What is needed therefore, and an object of the present invention, is method, apparatus, and techniques for protecting an amplifier against sharp changes in output power.

BRIEF SUMMARY

A transmitter for a code division multiple access radio access network intelligently preconditions a channel-merged signal which is applied to its amplifier so that the amplifier does not experience, e.g., precipitous power changes. The transmitter comprises an amplifier for amplifying the channel-merged signal at a signal output power; a detector for performing detection of when output power of the channel-merged signal is about to change by a specified amount; and, a noise inserter for adding a noise signal to the channel-merged signal in dependence upon the detection. Insertion of the noise smoothes an edge of the power change curve and thereby averts stress for the amplifier.

In an example embodiment, the transmitter further comprises means for multiplying each of plural data channels by pseudo noise codes to provide code-modulated data channel signals, as well as means for adding the plural code-modulated data channel signals to a radio frequency carrier to produce the channel-merged signal.

One type of amplifier that is particularly suited for use in the transmitter is a multi-carrier power amplifier (MCPA). The specified amount of power change that prompts noise insertion is dependent upon characteristics of the amplifier, such as (for example) the MCPA design, the MCPA total dynamics, the MCPA resolution. The specified amount of power change can be predetermined or adaptive, e.g., based on recent level measurements. For example, an amplifier and/or power supply may accept one or two peaks, but need smoothing if the peaks are frequent. In one non-limiting example implementation, the specified amount is a thirty db power change.

Preferably the noise signal that is inserted is configured to have an amplitude to avoid significant interference with the code-modulated data channel signals. The inserted noise signal can be obtained in various ways and from various sources. For example, the noise signal can be either a digital signal or an analog signal. Further, the noise signal can be a signal that has a primary functionality different from noise insertion. For example, the noise signal that is inserted can be obtained from another signal source of a radio base station (RBS) node which includes the transmitter. Examples of other signal sources include a clock signal, an address pin on a CPU of the RBS, or a data bus signal. Alternatively, the noise signal can be without the radio access network. Examples of such external signals include data from a global positioning system (GPS) receiver, a 20 MHz clock signal from an Ethernet interface, or even music from a local radio station. Alternatively, the noise can be a combination of pseudo noise codes which are not employed to modulate one of plural data channels comprising the channel-merged signal.

In another of its aspects, the technology includes a method of operating a transmitter for a code division multiple access radio access network. The method comprises amplifying a channel-merged signal at a signal output power; performing detection of when the signal output power is about to change by a specified amount; and adding a noise signal to the channel-merged signal in dependence upon the detection for affecting (e.g., modifying, mitigating, or lessening the amount of) the change. The method preferably further includes configuring the noise signal to have an amplitude to avoid significant interference with the code-modulated data channel signals. The method can include providing the noise signal as a digital signal or as an analog signal. The method can further include obtaining the inserted noise signal in various ways and from various sources such as those summarized above and described in more detail hereinafter.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. That is, those skilled in the art will be able to devise various arrangements which, although not explicitly described or shown herein, embody the principles of the invention and are included within its spirit and scope. In some instances, detailed descriptions of well-known devices, circuits, and methods are omitted so as not to obscure the description of the present invention with unnecessary detail. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that block diagrams herein can represent conceptual views of illustrative circuitry embodying the principles of the technology. Similarly, it will be appreciated that any flow charts, state transition diagrams, pseudocode, and the like represent various processes which may be substantially represented in computer readable medium and so executed by a computer or processor, whether or not such computer or processor is explicitly shown.

The functions of the various elements including functional blocks labeled as "processors" or "controllers" may be provided through the use of dedicated hardware as well as hardware capable of executing software in association with appropriate software. When provided by a processor, the functions may be provided by a single dedicated processor, by a single shared processor, or by a plurality of individual processors, some of which may be shared or distributed. Moreover, explicit use of the term "processor" or "controller" should not be construed to refer exclusively to hardware capable of executing software, and may include, without limitation, digital signal processor (DSP) hardware, read only memory (ROM) for storing software, random access memory (RAM), and non-volatile storage.

Figure 1:
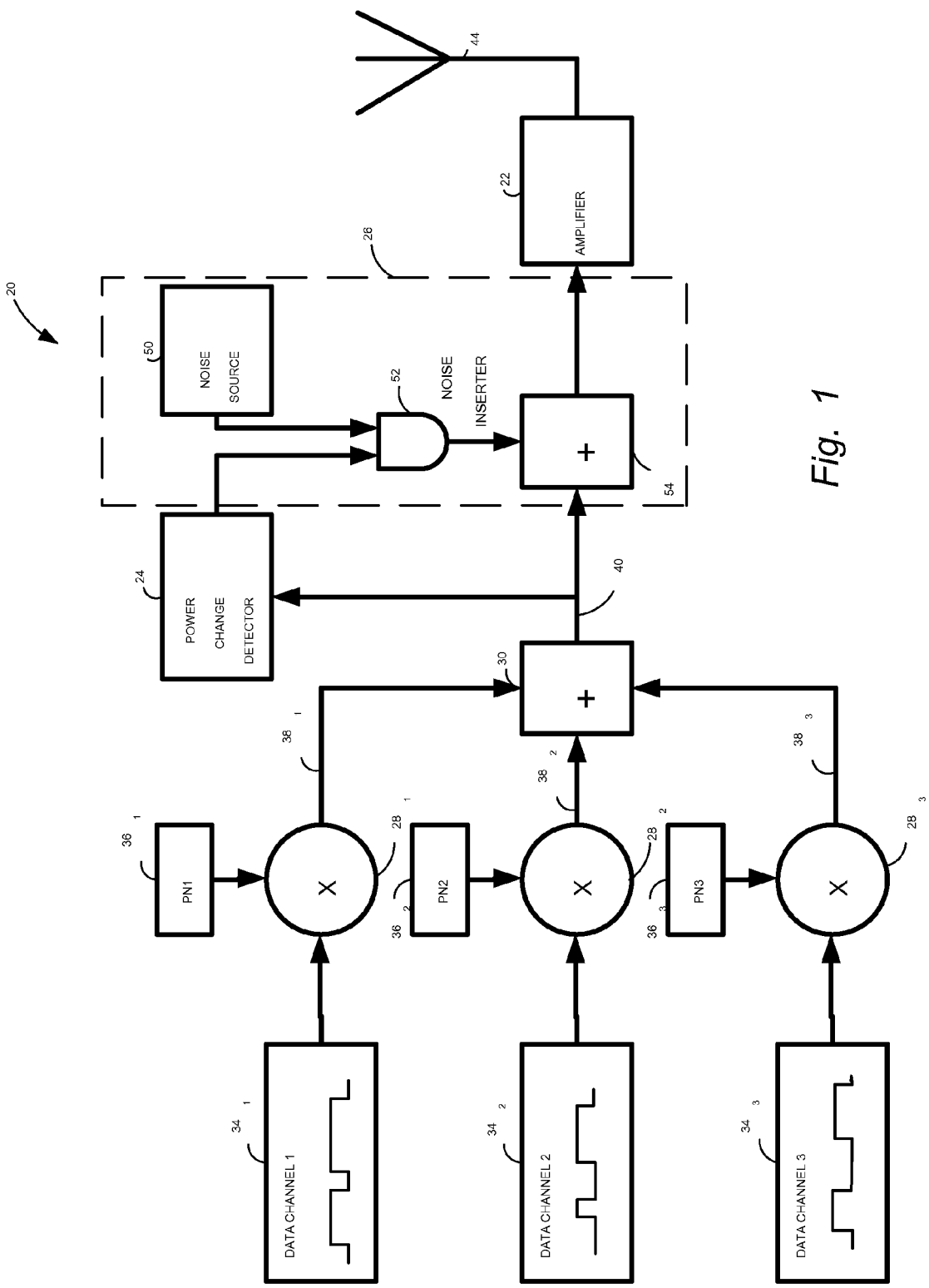
FIG. 1 is diagrammatic view of a first example transmitter for a code division multiple access radio access network which intelligently preconditions a channel-merged signal, and showing a generic noise source.

FIG. 1 shows an example embodiment of a transmitter for a code division multiple access radio access network which intelligently preconditions a channel-merged signal which is applied to its amplifier so that the amplifier does not experience, e.g., precipitous power changes. The example embodiment transmitter, shown generally as transmitter 20 in FIG. 1, comprises an amplifier 22; a detector 24; and, a noise inserter 26. In addition, in an example embodiment of FIG. 1, the transmitter 20 comprises plural multipliers 28 and a summer 30.

The amplifier 22 is preferably situated at a transmitting node of a radio access network, e.g., at a radio base station (RBS) or base station (BS) of a radio access network such as UTRAN.

The multipliers 28 multiply each of plural data channels by pseudo noise codes to provide code-modulated data channel signals. In this regard, FIG. 1 shows three example data channels 34, i.e., data channel $34_1$, data channel $34_2$, and data channel $34_3$, which are connected to first inputs of respective multipliers $28_1$, $28_2$, and $28_3$. Second inputs of the multipliers $28_1$, $28_2$, and $28_3$ are respectively connected to pseudo noise code sources $36_1$, $36_2$, and $36_3$, respectively. The outputs of the pseudo noise code sources $36_1$, $36_2$, and $36_3$ apply code-modulated data channel signals on lines $38_1$, $38_2$, and $38_3$, respectively, to respective inputs of summer 30. The summer 30 adds the plural code-modulated data channel signals received from multipliers $28_1$, $28_2$, and $28_3$ to a radio frequency carrier in conventional fashion to produce a channel-merged signal carried on line 40. As used herein, "channel-merged signal" refers to the radio frequency carrier which is modulated by the channel-merged signal.

The amplifier 22 is connected to an output of the summer 30 and amplifies the channel-merged signal at a signal output power. The channel-merged signal applied to amplifier 22 may have an additional noise signal included therein as herein described. The amplified channel-merged signal is applied from amplifier 22 to antenna(e) 44.

It will be appreciated that the number of data channels 34, and thus the number of multipliers 28 and pseudo noise code sources 36, have arbitrarily been illustrated as three merely for sake of convenience. In fact, two or more data channels may be applied to transmitter 20, such number not being critical but perhaps influential in overall operation of the transmitter 20.

An input of detector 24 is connected to the output of summer 30, e.g., to receive the channel-merged signal carried on line 40. Connected to receive the channel-merged signal, detector 24 performs a detection of when output power of the channel-merged signal is about to change by a specified amount. An output of detector 24 is connected to noise inserter 26. The noise inserter 26 adds a noise signal to the channel-merged signal in dependence upon the detection performed by detector 24. In other words, if detector 24 determines that output power of the channel-merged signal is about to change by a specified amount, the noise inserter 26 is allowed to insert its noise signal for adding to the channel-merged signal. Insertion of the noise smoothes an edge of the power change curve and thereby averts stress for the amplifier.

FIG. 1 shows an example implementation wherein noise inserter 26 comprises noise source 50; a noise gate 52; and, a noise adder 54. When the output signal of detector 24 so authorizes (e.g., when the detection performed by detector 24 indicates that output power of the channel-merged signal is about to change by a specified amount), a noise signal generated by noise source 50 is gated through noise gate 52 where it is added by noise adder 54 to the channel-merged signal carried on line 40. The noised-enhanced channel-merged signal is then applied to antenna(e) 44.

One type of amplifier that is particularly suited for use in the transmitter is a multi-carrier power amplifier (MCPA). The specified amount of power change that prompts noise insertion (e.g., the threshold power change used by detector 24 for performing its detection) can be and typically is dependent upon characteristics of the amplifier, such as (for example) the amplifier design, the amplifier total dynamics, the amplifier resolution. The specified amount of power change can be predetermined or adaptive, e.g., based on recent level measurements. For example, an amplifier and/or power supply may accept one or two peaks, but need smoothing if the peaks are frequent. In one non-limiting example implementation, the specified amount is a thirty db power change.

Preferably the noise signal that is generated by noise source 50 and inserted by noise inserter 26 is configured to have an amplitude to avoid significant interference with the code-modulated data channel signals, e.g., with the signals output by the multipliers 28. As explained below, the inserted noise signal can be obtained in various ways and from various sources.

Figure 2:
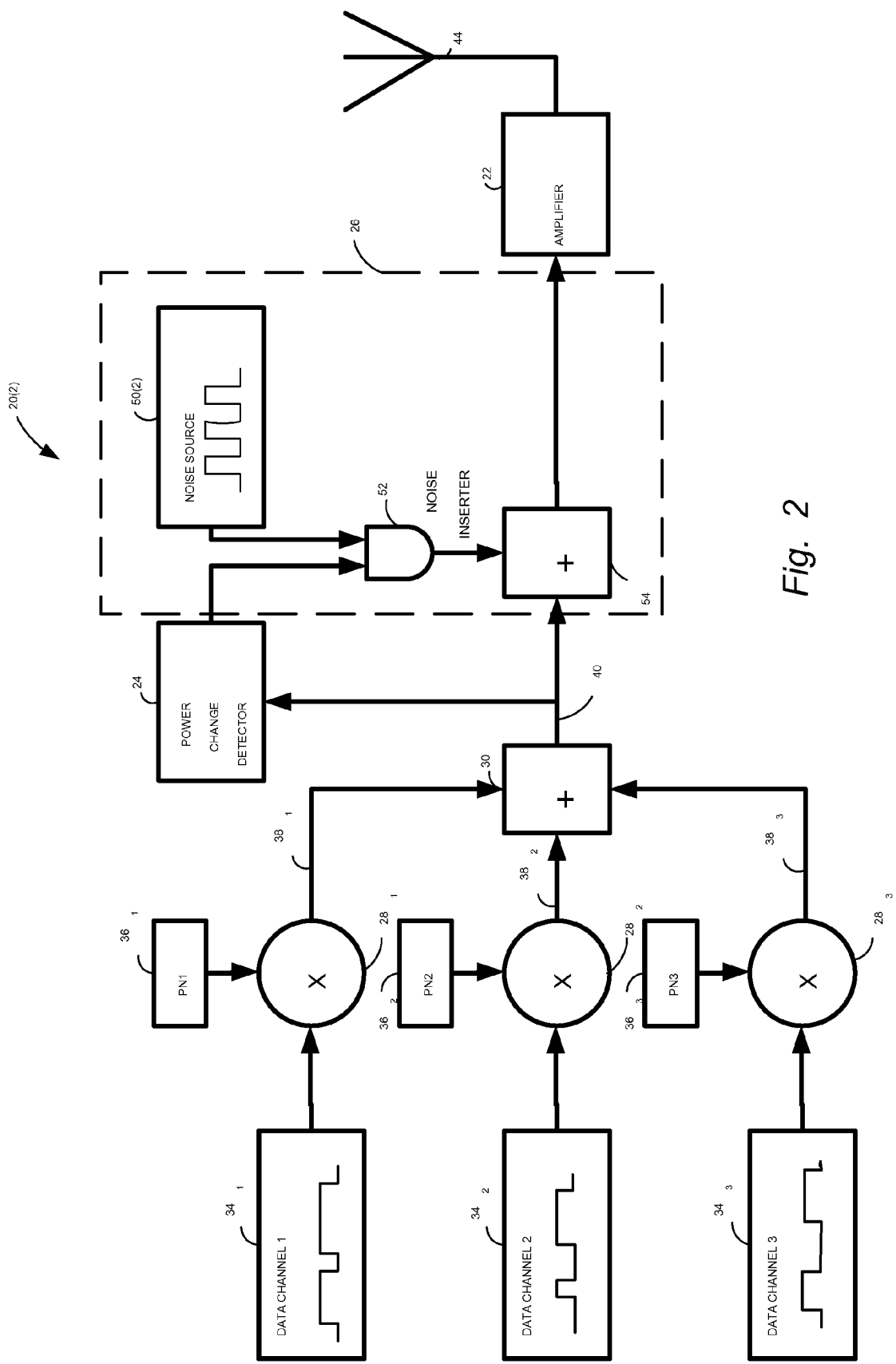
FIG. 2 is diagrammatic view of a second example transmitter, the second example transmitter having a digital signal noise source.

For example, FIG. 2 illustrates that the noise signal can be a digital signal, e.g., generated by digital noise source 50(2). A digital signal can be a signal like a PNx (x=9, 15, . . . ) pattern for example.

Figure 3:
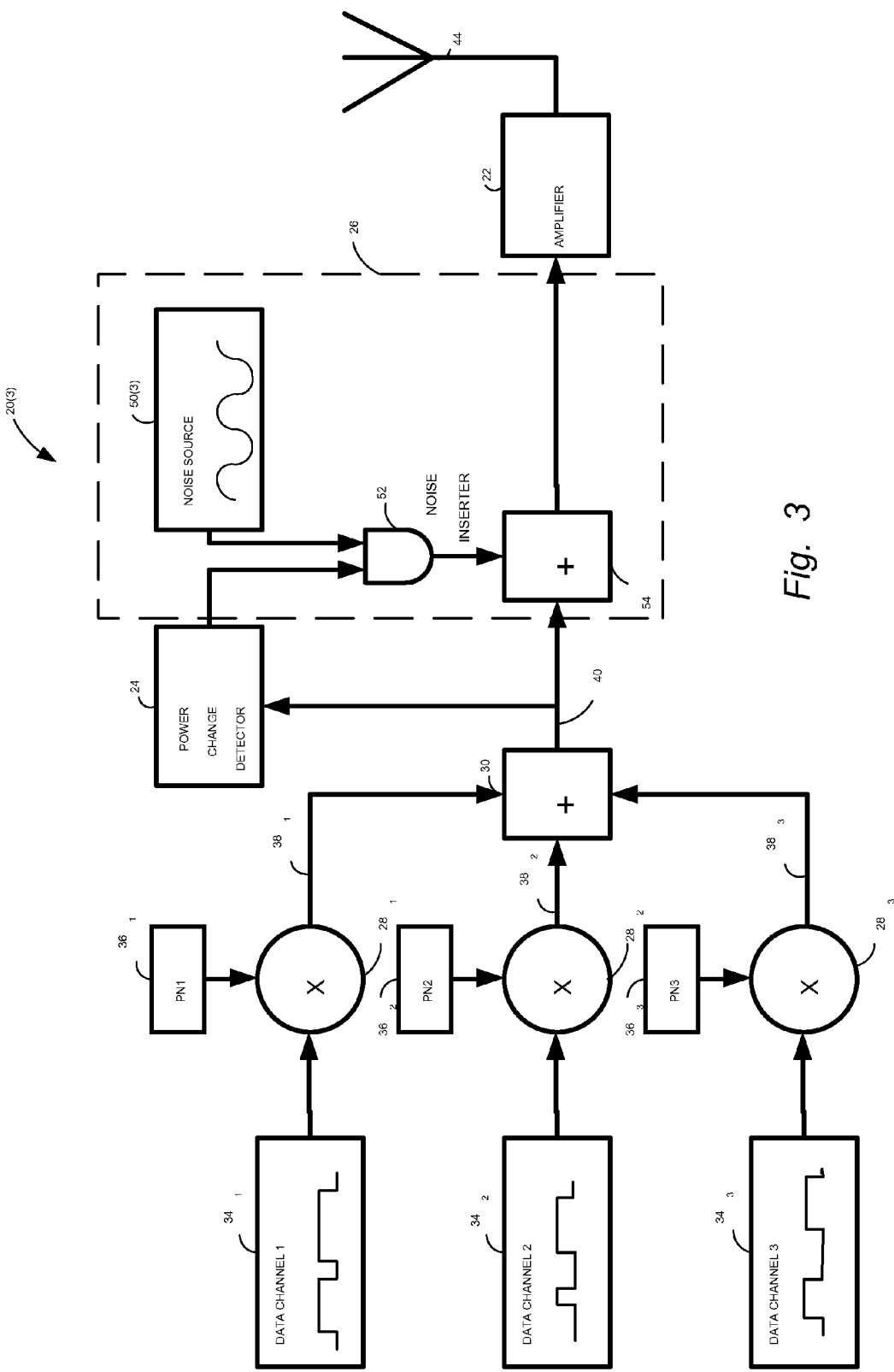
FIG. 3 is diagrammatic view of a third example transmitter, the third example transmitter having an analog signal noise source.

FIG. 3 illustrates that the noise signal can be an analog signal, e.g., generated by digital noise source 50(3).

Figure 4:
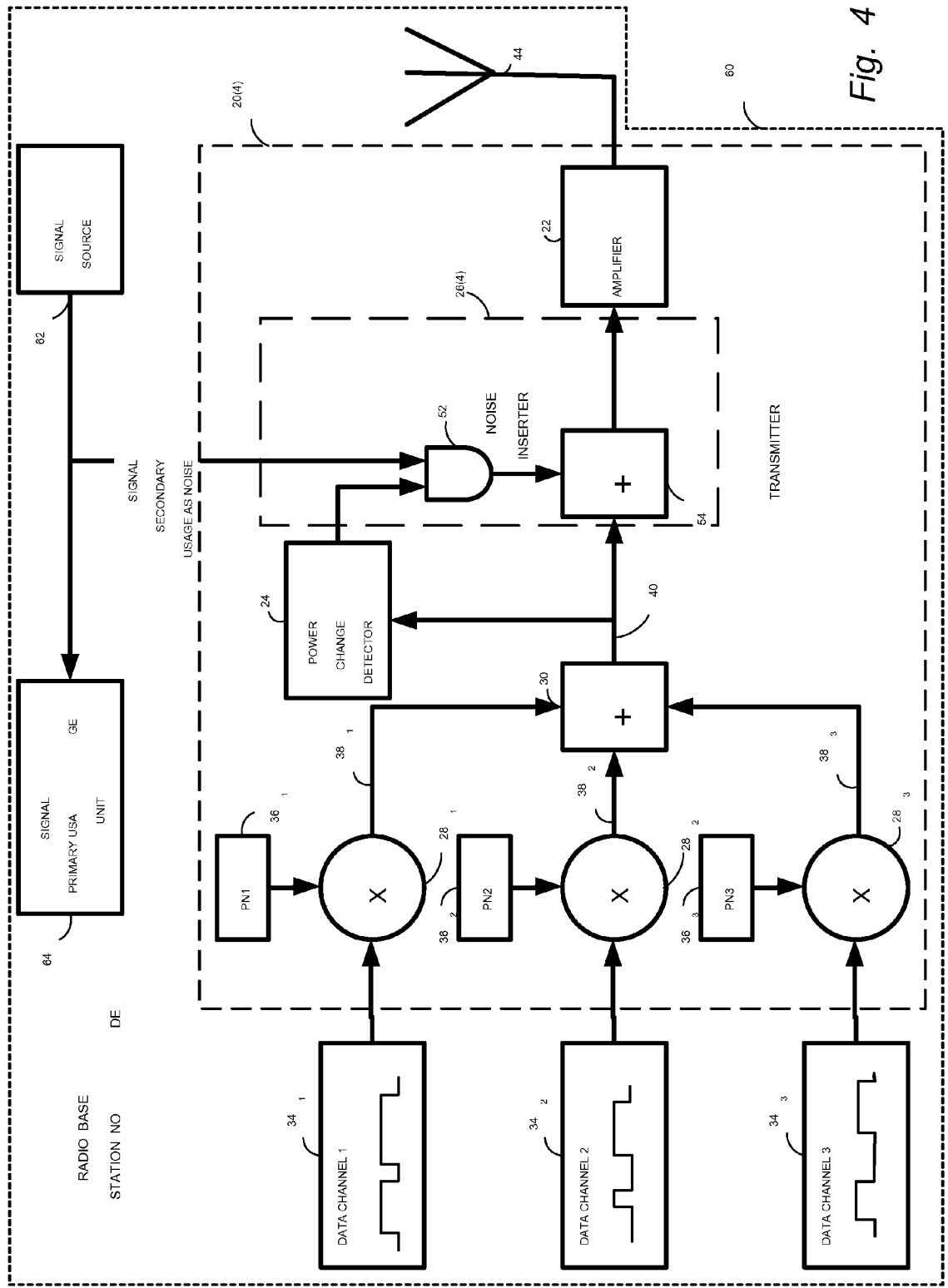
FIG. 4 is diagrammatic view of a fourth example transmitter, the fourth example transmitter having noise obtained from another signal source of a radio base station (RBS) node

Further, the noise signal can be a signal that has a primary functionality different from noise insertion. For example, the noise signal that is inserted can be obtained from another signal source of a radio base station (RBS) node which includes the transmitter. By way of generic example, FIG. 4 shows transmitter 20 as being part of a radio base station node 60. The radio base station node 60 includes various unillustrated elements and units commonly found at a radio base station, but known to the person skilled in the art. The radio base station node 60 specifically includes a signal source 62 which generates a signal whose primary function is for other than noise. In this regard, FIG. 4 shows the signal generated by signal source 62 as being applied to a representative, generic signal primary usage unit 64. But the signal generated by signal source 62 is also applied to noise inserter 26(4) for use as noise to be inserted to the channel-merged signal. Examples of other signal sources (generated, e.g., signal source 62) include a clock signal, an address pin on a CPU of the RBS, or a data bus signal.

Figure 5:
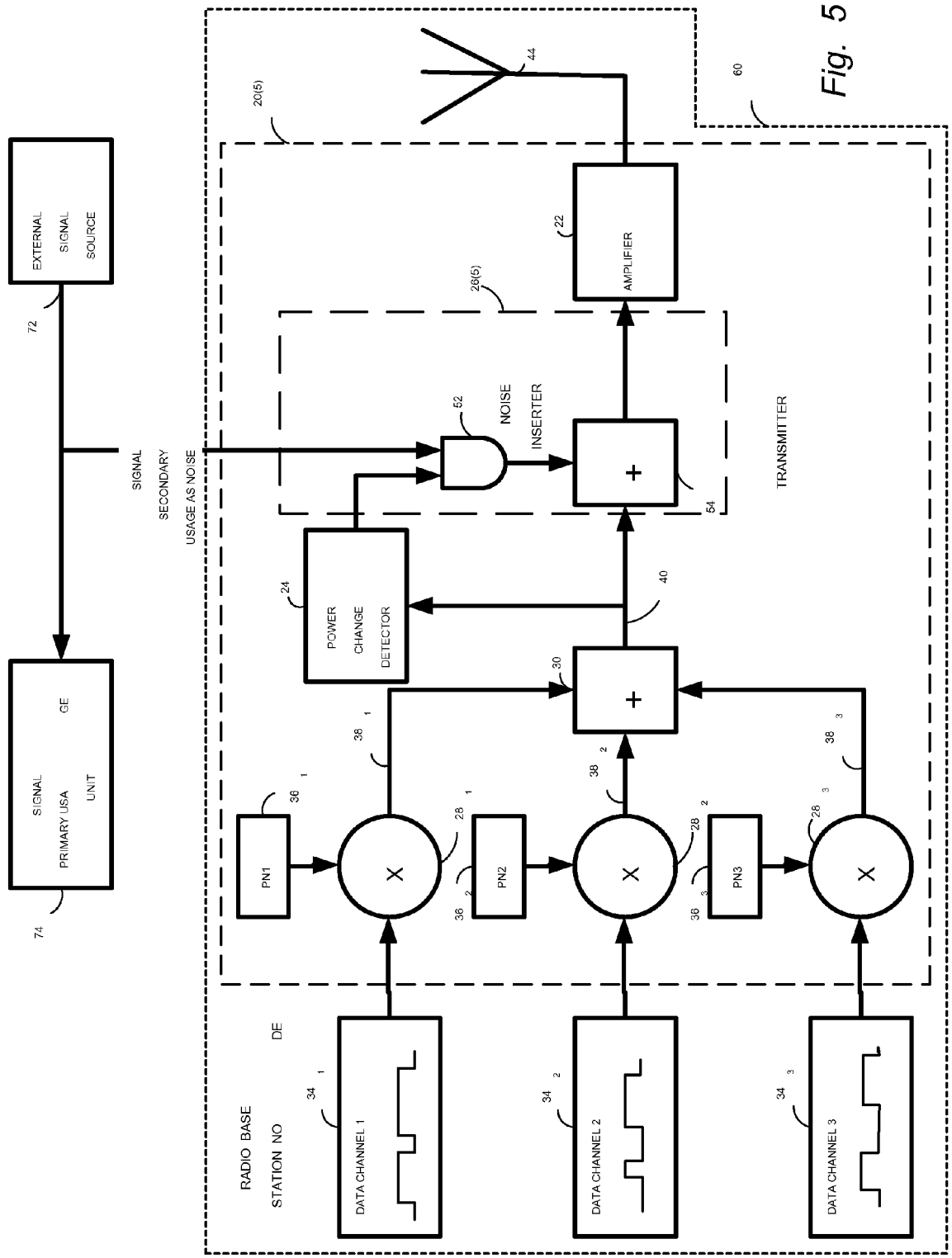
FIG. 5 is diagrammatic view of a fifth example transmitter, the fifth example transmitter having noise obtained from without (e.g., external to) a radio base station and even external to a radio access network.

Alternatively, as generically represented by FIG. 5, the noise signal applied to the noise inserter can be obtained from without (e.g., external to) the radio base station and even external to the radio access network. In this regard, FIG. 5 shows the signal generated by signal source 72 as being applied to a representative, generic signal primary usage unit 74. But the signal generated by signal source 72 is also applied to noise inserter 26(4) for use as noise to be inserted to the channel-merged signal. Examples of such external signals (generated, e.g., signal source 72) include data from a global positioning system (GPS) receiver, a 20 MHz clock signal from an Ethernet interface, or even music from a local radio station.

Figure 6:
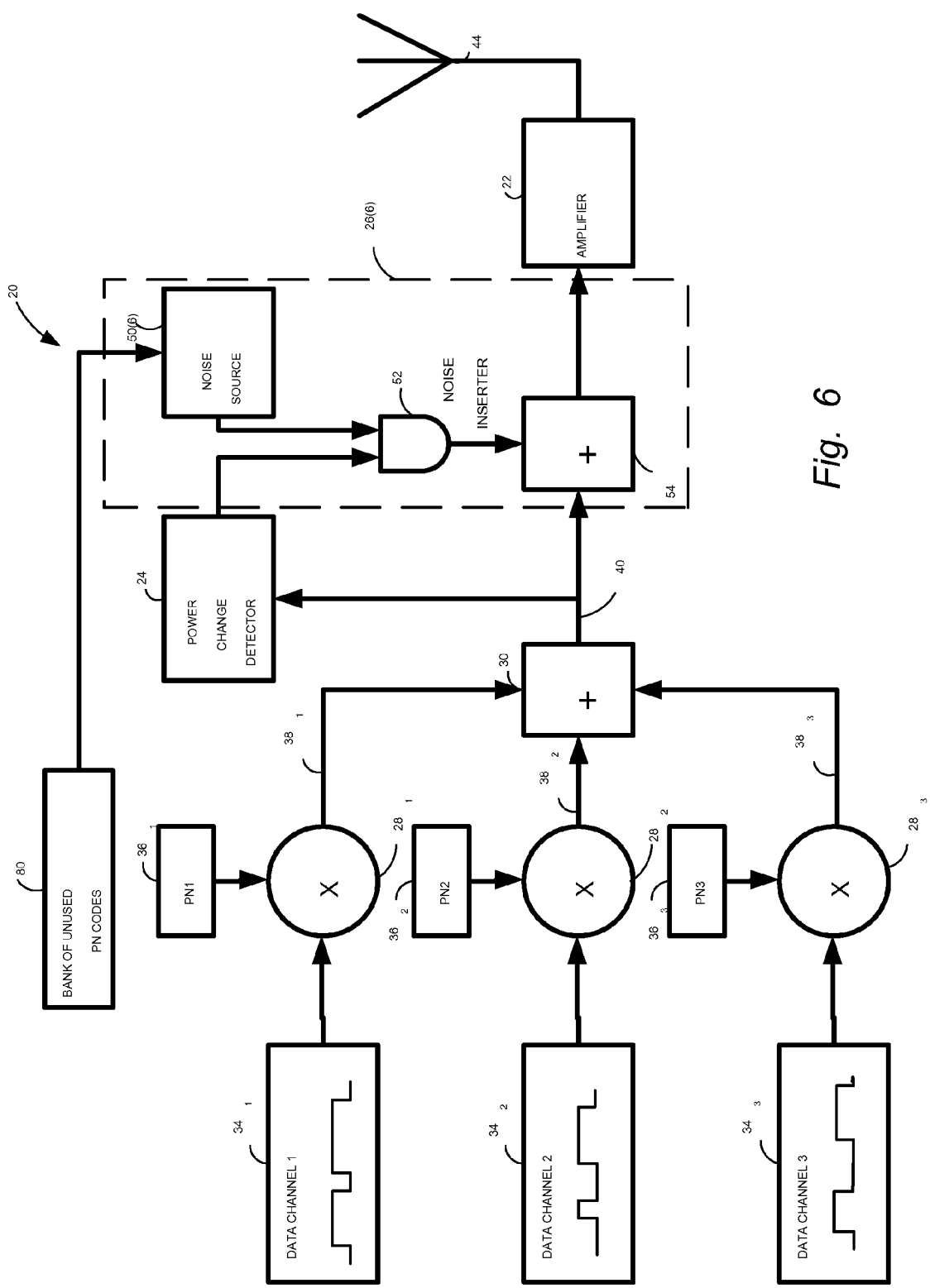
FIG. 6 is diagrammatic view of a sixth example transmitter, the sixth example transmitter having noise obtained from unused pseudo noise code(s) or sequence(s).

FIG. 6 illustrates another example embodiment wherein the noise that is inserted by noise source 50(6) is one or more unused pseudo noise codes (e.g., unused PN sequences, i.e., PN sequences that are not represented by the employed PN code sources 36 and that are not multiplied as a data channel 34 by a multiplier 28). Preferably a combination of unused PN sequences are used by noise source 50(6). Noise source 50(6) has access to a bank 80 of such unused PN codes. Inserting unused PN codes as noise can ensure an insignificant change of the signal by spreading the noise in a controlled way over several codes.

In addition to the foregoing, the noise signal can (in other embodiments) be any predefined signal that is not noise. Another approach for the power null smoothing facilitated hereby is, upon detection of the specified increase or decrease, to change either (1) the level of the existing signal(s) to smoothen the edge instead of inserting noise, or (2) the phase of the existing signals. Changing the phase of an existing signal could involve, for example, adding two equal sine waves shifted one hundred eighty degrees. The two added sine waves would cancel out and their sum would be zero. If, for example, shifted one hundred sixty degrees apart instead, the two waves would not cancel out.

It will be appreciated that the technological concepts described above can also be expressed and/or implemented as a filter function.

The transmitter 20 of FIG. 1 essentially has its detector 24 and at least a portion of its noise inserter 26 positioned in parallel to the summer 30 and the output of summer 30 applied on line 40. If the noise inserter 26 is activated by detector 24, the noise is inserted in series and summed between summer 30 and amplifier 22. In a parallel embodiment (such as FIG. 1) wherein at least a portion of the noise inserter is in parallel, a delay is typically needed (e.g., at the input of adder 54) to give the power change detector sufficient time to perform its detection.

Figure 7:
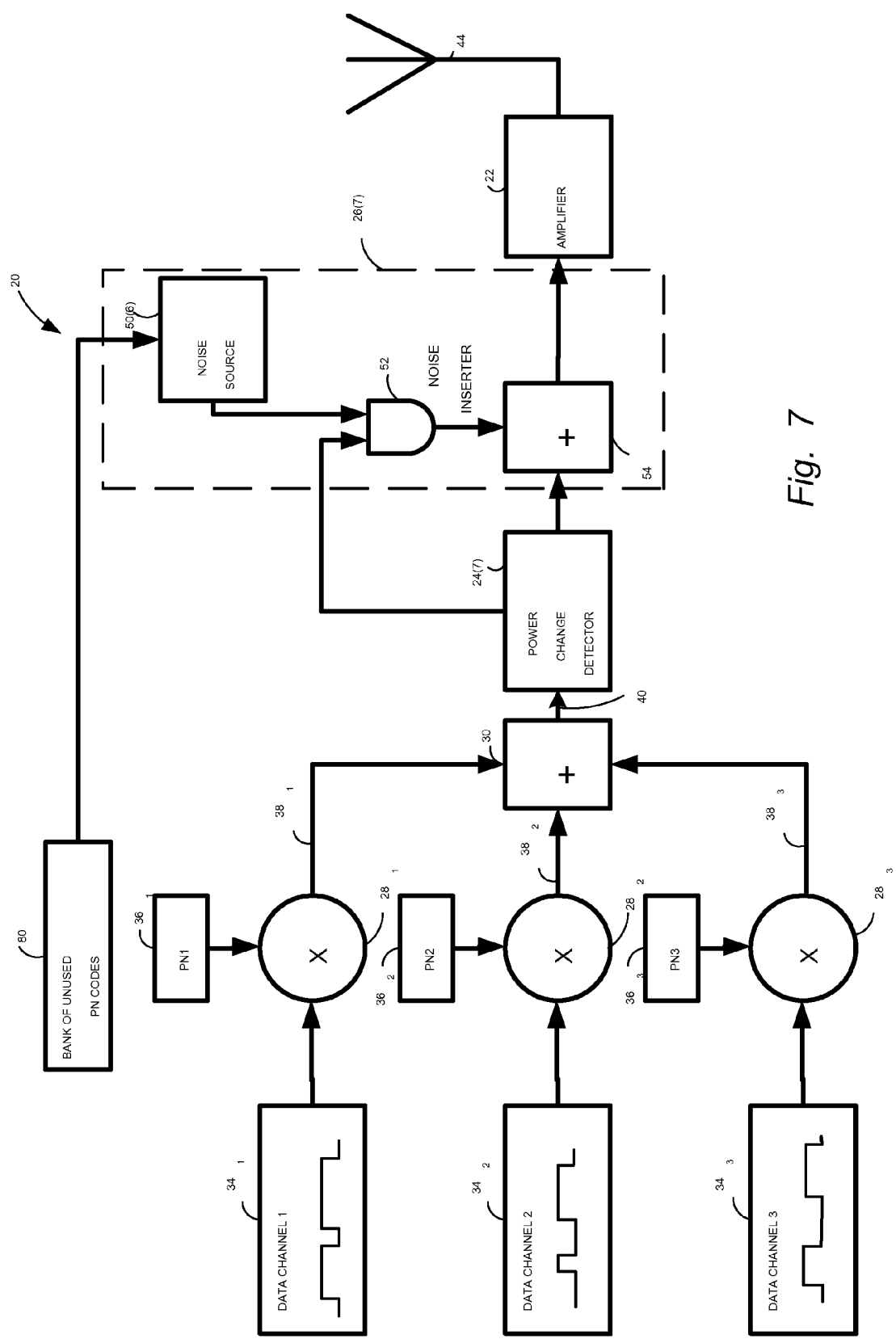
FIG. 7 is diagrammatic view of a sixth example transmitter, the seventh example transmitter having a detector and noise inserter connected in series.

FIG. 7 illustrates another example embodiment of a transmitter, and particularly shows devices having the functionality of the detector 24(7) and the noise inserter 26(7) connected in series between summer 30 and amplifier 22. Such serial embodiment differs, e.g., from the parallel embodiments since, e.g., the serial embodiment does not necessarily require a delay to give the power change detector time to perform its operation.

The embodiments of transmitters encompassed by the technology, including but not limited to the parallel implementation and the serial implementation embodiments described above, can be realized in hardware, in software, or in a combination of hardware and software. FIG. 1 and the other embodiments above described illustrated how the detector 24 and noise inserter 26 can be realized in hardware, e.g., as discrete hardware or circuit elements. In terms of software implementation, the functions of detector 24 and noise inserter 26, or at least portions thereof, can be provided by a processor or controller.

Figure 8:
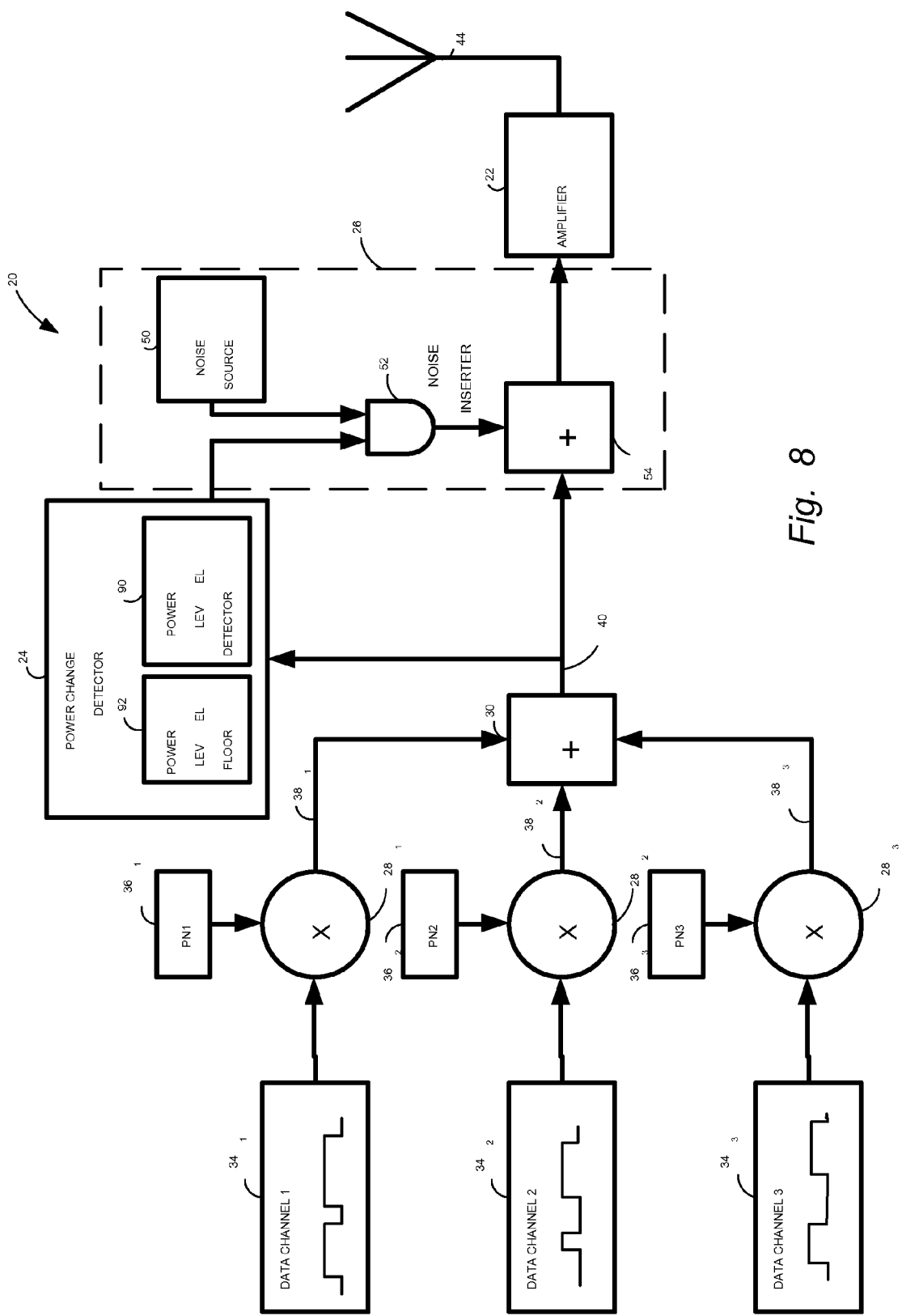
FIG. 8 is diagrammatic view of an example transmitter wherein a power change detector further includes a power level detector and a power level floor for ensuring that power level does not drop below a predetermined floor value.

As shown in FIG. 8, the power change detectors for any or all of embodiments described herein preferably include a power level detector 90. The power level detector 90 compares the existing power level to a power level floor value (the power level floor value can be stored in a register or memory device such as memory 92). Using its power level detector 90, the power change detector 24 ensures that the output power never falls below the power floor value. The power floor value can be, for example, 3 dBm.

To enable detector 24 to perform its detection of when output power of the channel-merged signal is about to change by a specified amount, a slight delay can be provided to allow for the detection. Such delay can be accommodated by delaying the channel-merged signal if needed. For a software implementation, the delay can be facilitated by signal processing.

In another of its aspects, the technology includes a method of operating a transmitter for a code division multiple access radio access network. The method comprises amplifying a channel-merged signal at a signal output power; performing detection of when the signal output power is about to change by a specified amount; and adding a noise signal to the channel-merged signal in dependence upon the detection for affecting (e.g., modifying, mitigating, or lessening the amount of) the change. The method preferably further includes configuring the noise signal to have an amplitude to avoid significant interference with the code-modulated data channel signals. The method can include providing the noise signal as a digital signal or as an analog signal. The method can further include obtaining the inserted noise signal in various ways and from various sources such as those described above, e.g., with reference to FIG. 2-FIG. 6, for example.

Figure 9:
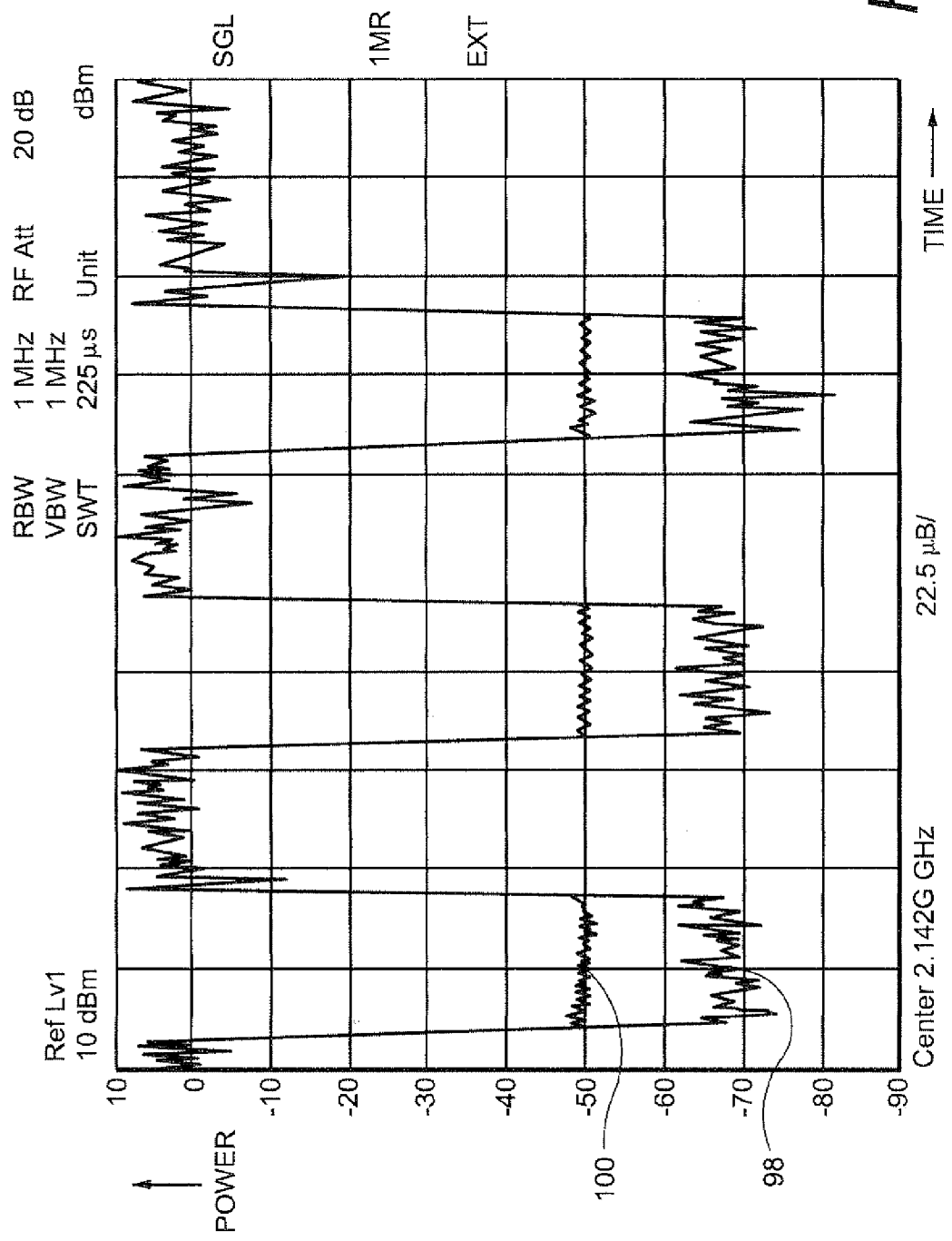
FIG. 9 is a graph showing power of an amplified channel-merged signal as a function of time.

FIG. 9 is a graph showing power of an amplified channel-merged signal (as output from amplifier 22) as a function of time. FIG. 9 shows both a power drop (which is the transition when the output signal fades) and a power rise or increase (which is the transition from a very low power level back to normal output power) in the power output from amplifier 22. Without the noise insertion provided by noise inserter 26, the amplified channel-merged signal could, during a power drop, have deep nulls or troughs as indicated, for example, by arrow 98. But in view of detector 24 performing its detection of when output power of the amplified channel-merged signal is about to change by a specified amount, and noise inserter 26 inserting an appropriate noise signal so that the amplified channel-merged signal will not reach the null, low, or trough of arrow 98, the amplified noise-inserted channel-merged signal instead has as a smoothed or less pronounced minimum power value, as depicted by arrow 100 in FIG. 9.

As explained above, detector 24 detects when the output power of is about to suddenly drop or increase by more than a specified amount, e.g., 30 dB. The particular value of the specified amount is dependent upon such factors as (for example) the amplifier design, the amplifier total dynamics, the amplifier resolution. In one non-limiting example implementation, the specified amount is a thirty db power change. When the increase or decrease is anticipated to be by the specified amount, the detector 24 authorizes noise inserter 26 to add a (e.g., weak) noise signal to smoothen the edge of the power change. One factor is that the added noise signal amplitude is small enough to avoid significant interference with the original signal(s), but large enough to smoothen the edge.

The detection and noise insertion is thus performed at the same point as for power clipping. However, noise insertion addresses low signal power levels rather than high signal power levels, and in this sense performs a transmitter power "null smoothing".

Noise insertion is a very cost effective way to reduce the stress on the amplifier (e.g., MCPA) and reduces the need for costly solutions in the design of the radio base station to handle the resulting stress problems. For example, the technology described herein mitigates what otherwise would be quick drops in output power, and thereby also mitigates (1) rapid current changes that put stress on the whole RBS power supply; (2) significant electromagnetic interference (EMI); and (3) noise on the MCPA output signal. It is also possible to implement noise insertion as a software upgrade for existing RBSs and thus improve their robustness without hardware modifications.

Figure 10:
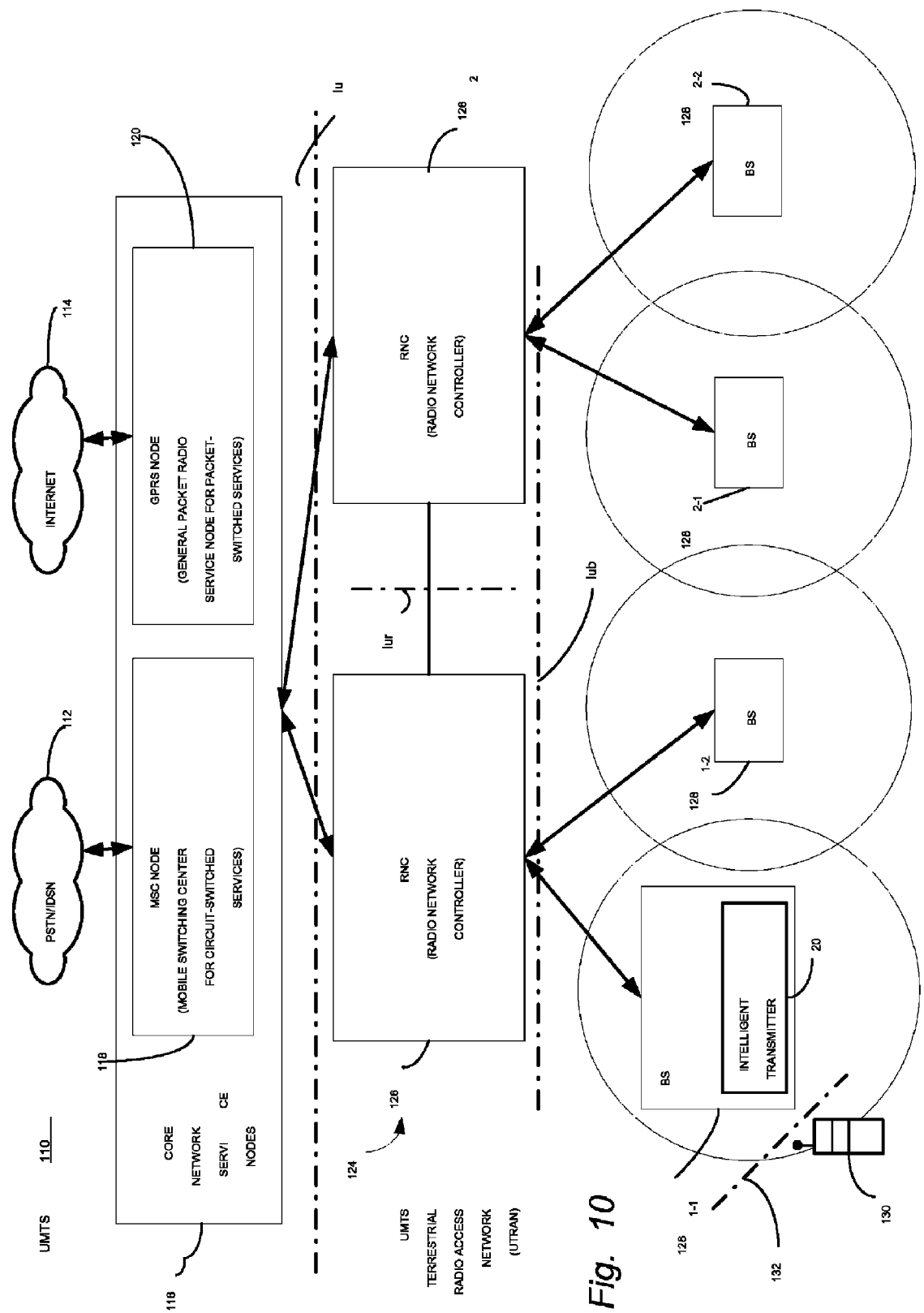
FIG. 10 is diagrammatic view of example mobile communications system in which a transmitter of the present technology may be advantageously employed.

The present technology is suited for use in the non-limiting, example context of a universal mobile telecommunications (UMTS) 110 shown in FIG. 10. A representative, connection-oriented, external core network, shown as a cloud 112 may be for example the Public Switched Telephone Network (PSTN) and/or the Integrated Services Digital Network (ISDN). A representative, connectionless external core network shown as a cloud 114, may be for example the Internet. Both core networks are coupled to their corresponding service nodes 116. The PSTN/ISDN connection-oriented network 112 is connected to a connection-oriented service node shown as a Mobile Switching Center (MSC) node 118 that provides circuit-switched services. The Internet connectionless-oriented network 114 is connected to one or more packet switching service node(s) tailored to provide packet-switched type services (such nodes possibly including, for example, a Gateway General Packet Radio Service (GPRS) support node (GGSN), a General Packet Radio Service (GPRS) Service (SGSN)).

Each of the core network service nodes 118 and 120 connects to a UMTS Terrestrial Radio Access Network (UTRAN) 124 over a radio access network (RAN) interface referred to as the Iu interface. UTRAN 124 includes one or more radio network controllers (RNCs) 126 and one or more base stations (BS) 128. For sake of simplicity, the UTRAN 124 of FIG. 10 is shown with only two RNC nodes, particularly RNC $126_1$ and RNC $126_2$. Each RNC 126 is connected to one or more base stations (BS) 128. For example, and again for sake of simplicity, two base station nodes are shown connected to each RNC 126. In this regard, RNC $126_1$ serves base station $128_{1-1}$ and base station $128_{1-2}$, while RNC $126_2$ serves base station $128_{2-1}$ and base station $128_{2-2}$. It will be appreciated that a different number of base stations can be served by each RNC, and that RNCs need not serve the same number of base stations. Moreover, FIG. 10 shows that an RNC can be connected over an Iur interface to one or more other RNCs in the UTRAN 124. Further, those skilled in the art will also appreciate that a base station is sometimes also referred to in the art as a radio base station, a node B, or B-node.

In the illustrated embodiments, for sake of simplicity each base station 128 is shown as serving one cell. Each cell is represented by a circle which surrounds the respective base station. It will be appreciated by those skilled in the art, however, that a base station may serve for communicating across the air interface for more than one cell. For example, two cells may utilize resources situated at the same base station site. Moreover, each cell may be divided into one or more sectors, with each sector having one or more cell/carriers.

A user equipment unit (UE), such as user equipment unit (UE) 130 shown in FIG. 10, communicates with one or more cells or one or more base stations (BS) 128 over a radio or air interface 132 (e.g., the Uu interface). Each of the radio interface 132, the Iu interface, the Iub interface, and the Iur interface are shown by dash-dotted lines in FIG. 10.

Figure 11:
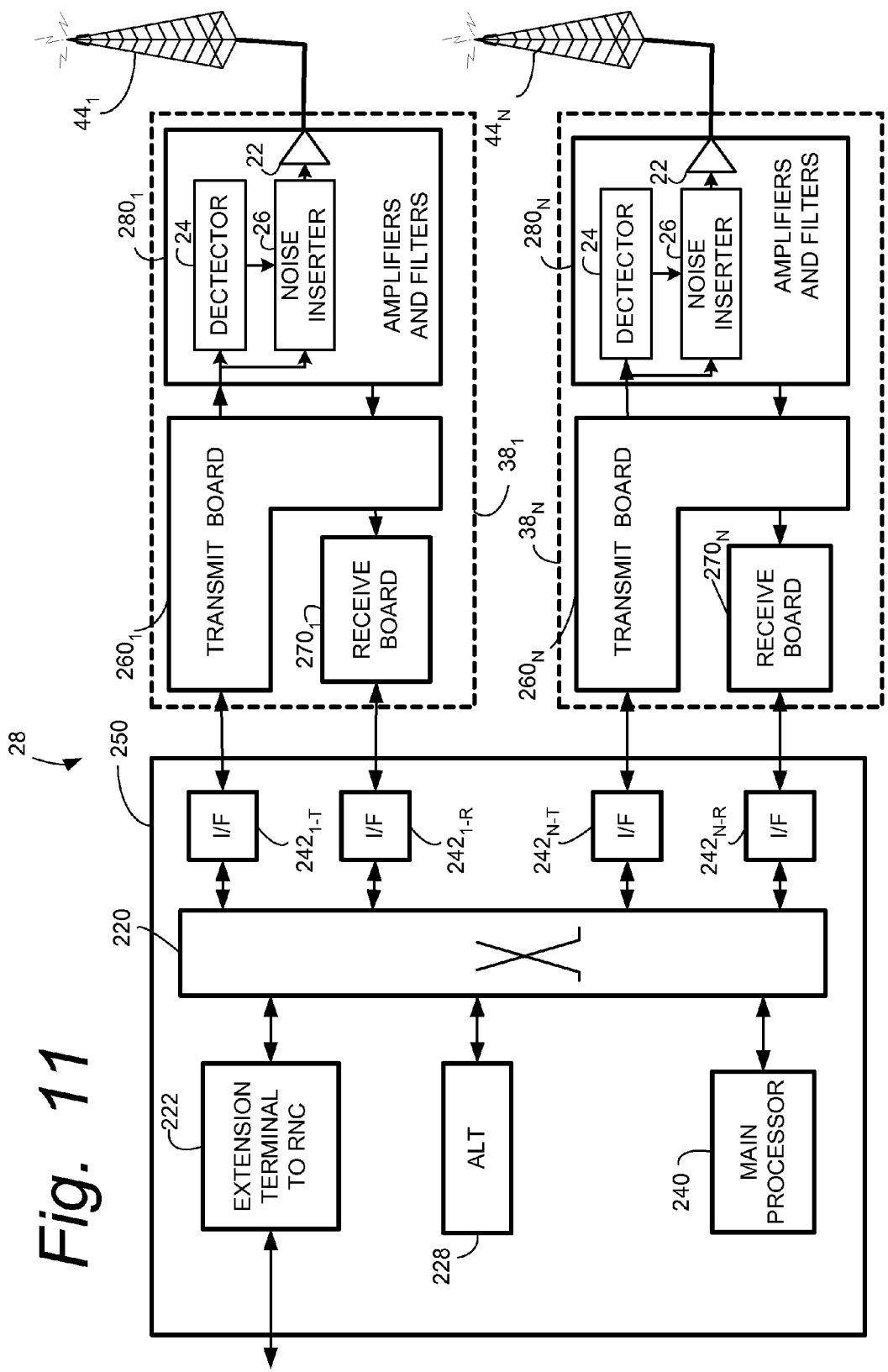
FIG. 11 is a schematic view of an example base station node in accordance with one example embodiment.

FIG. 11 illustrates, in non-limiting manner, more details of an example base station (BS) node 128 in accordance with one embodiment of the present invention. The base station (BS) node 128 of FIG. 11 can be (for example) a switched-based node having a switch 220 which serves to interconnect other constituent elements of base station (BS) node 128. Such other constituent elements include extension terminal 222; ALT unit 228; BS main processor 240, and interface boards 242. Extension terminal 222 connects base station (BS) node 128 to radio network controller (RNC) node 126, and thus comprises the Iub interface. ALT unit 228 is a unit provides, e.g., multiplexing and demultiplexing and (optionally) queuing with regard to differing protocols of cells.

The embodiment of base station (BS) node 28 illustrated in FIG. 11 is housed in a rack having multiple subracks. Each subrack has one or more boards, e.g., circuit boards, mounted thereon. A first subrack 250 contains boards for each of extension terminal 222; ALT unit 228; BS main processor 240, and interface boards 242. Each of the interface boards 242 is connected to a board on another subrack, e.g., one of the transmitter boards 260 or one of the receiver boards 270. Each receiver board 270 is connected to share certain transmitter/receiver resources in a corresponding transmitter board 260, with the transmitter board 260 being connected to a corresponding one of amplifiers and filters board 280. The amplifiers and filters board 280 is connected to an appropriate antenna 44. For example, interface board $242_{1\text{-}T}$ is connected to transmitter board $260_1$, while interface board $242_{1\text{-}R}$ is connected to receiver board $270_1$. The pair of transmitter board $260_1$ and receiver board $270_1$ is, in turn, connected to amplifiers and filters board $280_1$. Similar connections exist for a second pairing of transmitter board $260_2$ and receiver board $270_2$, which interface via interface board $242_{2\text{-}T}$ and interface board $242_{2\text{-}R}$, respectively. Each transceiver 38 of FIG. 11 thus comprises a subrack which includes a transmitter board 260, a receiver board 270, and amplifiers and filters board 280.

In the example embodiment of FIG. 11, the detector 24 and noise inserter 26 can be included, for example, in the amplifiers and filters board(s) 280, as shown. Alternatively, one or more of the detector 24 and noise inserter 26 can be included in the transmitter board(s) 260. Inclusion in the amplifiers and filters board(s) 280 can be appropriate in view of the fact that the detection and noise insertion can function as and be described in terms of an advanced band-pass filter. Further, the detection and noise insertion can be regarded as if hardware-implemented (e.g., analog) filter functions for detection.

A further embodiment can involve essentially continuous addition of a small (external) additional signal that prevents the combined power from being too low (outside the amplifier design). The person skilled in the art would realize how to design and build such a system by, e.g., essentially deleting the detector 24 of the transmitter 22 of FIG. 1. Such further embodiment with continuous signal/noise insertion would perhaps undesirably involve a constant performance reduction. However, performance reduction could be countered or overcome by adding noise in the form of unused codes, as described with reference to the embodiment of FIG. 6, for example.

Although various embodiments have been shown and described in detail, the claims are not limited to any particular embodiment or example. None of the above description should be read as implying that any particular element, step, range, or function is essential. The invention is not to be limited to the disclosed embodiment, but on the contrary, is intended to cover various modifications and equivalent arrangements.

What is claimed is:

1. A transmitter for a code division multiple access radio access network comprising:

an amplifier for amplifying signal output power of a channel-merged signal;

a detector performing detection of when the signal output power of the channel-merged signal is about to change and does change by a specified amount;

a noise inserter for adding a noise signal to the channel-merged signal after channel merger and before input to the amplifier in dependence upon the detection for affecting the change.

2. The apparatus of claim 1, further comprising:

means for multiplying each of plural data channels by pseudo noise codes to provide code-modulated data channel signals;

means for adding the plural code-modulated data channel signals to a radio frequency carrier to produce the channel-merged signal.

3. The apparatus of claim 1, wherein the amplifier is a multi-carrier power amplifier (MCPA).

4. The apparatus of claim 1, wherein the specified amount is adaptive based on recent power level measurements.

5. The apparatus of claim 1, wherein the specified amount is a thirty db power change.

6. The apparatus of claim 1, wherein the specified amount is dependent upon characteristics of the amplifier.

7. The apparatus of claim 1, wherein the noise signal is configured to have an amplitude to avoid significant interference with the code-modulated data channel signals.

8. The apparatus of claim 1, wherein the noise signal is a digital signal.

9. The apparatus of claim 1, wherein the noise signal is an analog signal.

10. The apparatus of claim 1, wherein the noise signal has a primary functionality different from noise insertion.

11. The apparatus of claim 1, wherein the noise signal is obtained from within a transmitter node of the radio access network.

12. The apparatus of claim 1, wherein the noise signal is obtained from without the radio access network.

13. The apparatus of claim 1, wherein the noise signal uses a combination of pseudo noise codes which are not employed to modulate one of plural data channels comprising the channel-merged signal.

14. The apparatus of claim 1, further comprising means for providing for a delay to allow for the detection that the channel-merged signal is about to change by a specified amount.

15. A method of operating a transmitter node of a code division multiple access radio access network comprising:

using an amplifier to amplify signal output power of a channel-merged signal;

using a detector of the transmitter node to perform detection of when the signal output power of the channel-merged signal is about to change and does change by a specified amount;

using a noise inserter of the transmitter node to add a noise signal to the channel-merged signal after channel merger and before input to the amplifier in dependence upon the detection for affecting the change.

16. The method of claim 15, further comprising multiplying each of plural data channels by pseudo noise codes to provide code-modulated data channel signals;

adding the plural code-modulated data channel signals to a radio frequency carrier to produce the channel-merged signal.

17. The method of claim 15, wherein the amplifier is a multi-carrier power amplifier (MCPA).

18. The method of claim 15, wherein the specified amount is adaptive based on recent power level measurements.

19. The method of claim 18, wherein the specified amount is a thirty db power change.

20. The method of claim 15, wherein the specified amount is dependent upon characteristics of the amplifier.

21. The method of claim 15, further comprising configuring the noise signal to have an amplitude to avoid significant interference with the code-modulated data channel signals.

22. The method of claim 15, further comprising providing the noise signal as a digital signal.

23. The method of claim 15, further comprising providing the noise signal as an analog signal.

24. The method of claim 15, further comprising providing the noise signal as a signal having a primary functionality different from noise insertion.

25. The method of claim 15, further comprising obtaining the noise signal from within a transmitter node of the radio access network.

26. The method of claim 15, further comprising obtaining the noise signal from without the radio access network.

27. The method of claim 15, wherein the noise signal uses a combination of pseudo noise codes which are not employed to modulate one of plural data channels comprising the channel-merged signal.

28. The method of claim 15, further comprising means providing a delay to allow for the detection that the channel-merged signal is about to change by a specified amount.

* * * * *

UNITED STATES PATENT AND TRADEMARK OFFICE
CERTIFICATE OF CORRECTION

| | | |
|---|---|---|
| PATENT NO. | : 7,940,833 B2 | Page 1 of 1 |
| APPLICATION NO. | : 11/425410 | |
| DATED | : May 10, 2011 | |
| INVENTOR(S) | : Norman et al. | |

It is certified that error appears in the above-identified patent and that said Letters Patent is hereby corrected as shown below:

On the Face Page, in the Figure, for Tag "92", in Line 2, delete "LEV EL" and insert -- LEVEL --, therefor.

On the Face Page, in the Figure, for Tag "90", in Line 2, delete "LEV EL" and insert -- LEVEL --, therefor.

In Fig. 8, Sheet 8 of 11, for Tag "92", in Line 2, delete "LEV EL" and insert -- LEVEL --, therefor.

In Fig. 8, Sheet 8 of 11, for Tag "90", in Line 2, delete "LEV EL" and insert -- LEVEL --, therefor.

In Fig. 10, Sheet 10 of 11, for Tag "112", in Line 1, delete "PSTN/IDSN" and insert -- PSTN/ISDN --, therefor.

In Fig. 10, Sheet 10 of 11, for Tag "118", in Line 3, delete "SERVI CE" and insert -- SERVICE --, therefor.

In Fig. 11, Sheet 11 of 11, in Box "$280_1$", for Tag "24", in Line 1, delete "DECTECTOR" and insert -- DETECTOR --, therefor.

In Fig. 11, Sheet 11 of 11, in Box "$280_N$", for Tag "24", in Line 1, delete "DECTECTOR" and insert -- DETECTOR --, therefor.

In Column 4, Line 9, delete "node" and insert -- node. --, therefor.

In Column 8, Line 46, delete "power of is" and insert -- power is --, therefor.

In Column 12, Line 11, in Claim 16, delete "comprising" and insert -- comprising: --, therefor.

Signed and Sealed this
Eleventh Day of October, 2011

David J. Kappos
*Director of the United States Patent and Trademark Office*